United States Patent
Jiang

(10) Patent No.: US 7,019,410 B1
(45) Date of Patent: Mar. 28, 2006

(54) DIE ATTACH MATERIAL FOR TBGA OR FLEXIBLE CIRCUITRY

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/471,071

(22) Filed: Dec. 21, 1999

(51) Int. Cl.
*H01L 23/48* (2006.01)
*H01L 21/48* (2006.01)

(52) U.S. Cl. ............ 257/783; 257/738; 257/780; 438/118; 156/330

(58) Field of Classification Search ...... 174/52.2–52.4, 174/255, 260, 261; 257/700, 778, 783, 734–738, 257/696, 690–694, 777, 788, 684, 779, 780, 257/782, 787; 438/118, 187, 108, 125, 612, 438/613

See application file for complete search history.

(56) References Cited

U.S. PATENT DOCUMENTS

| | | | | |
|---|---|---|---|---|
| 4,816,426 A | * | 3/1989 | Bridges et al. | 29/827 |
| 5,030,816 A | * | 7/1991 | Strecker | 219/91.2 |
| 5,045,921 A | | 9/1991 | Lin et al. | |
| 5,148,265 A | * | 9/1992 | Khandros et al. | 257/773 |
| 5,148,266 A | * | 9/1992 | Khandros et al. | 257/773 |
| 5,157,061 A | * | 10/1992 | Ito et al. | 523/433 |
| 5,166,228 A | * | 11/1992 | Shiobara et al. | 523/443 |
| 5,196,500 A | * | 3/1993 | Kreuz et al. | 528/125 |
| 5,216,278 A | | 6/1993 | Lin et al. | |
| 5,248,853 A | * | 9/1993 | Ishikawa et al. | 174/256 |
| 5,340,851 A | * | 8/1994 | Shiobara et al. | 523/443 |
| 5,347,159 A | * | 9/1994 | Khandros et al. | 257/692 |
| 5,536,909 A | * | 7/1996 | DiStefano et al. | 174/261 |
| 5,650,918 A | * | 7/1997 | Suzuki | 361/760 |
| 5,659,952 A | | 8/1997 | Kovac et al. | |
| 5,667,884 A | * | 9/1997 | Bolger | 428/323 |
| 5,677,566 A | * | 10/1997 | King et al. | 257/666 |
| 5,686,541 A | * | 11/1997 | Wang et al. | 525/528 |
| 5,707,730 A | * | 1/1998 | Oishi et al. | 428/344 |
| 5,817,540 A | * | 10/1998 | Wark | 438/107 |
| 5,821,456 A | * | 10/1998 | Wille et al. | 174/52.2 |
| 5,821,608 A | * | 10/1998 | DiStefano et al. | 257/669 |
| 5,821,609 A | | 10/1998 | DiStefano et al. | |
| 5,859,475 A | * | 1/1999 | Freyman et al. | 257/738 |
| 5,879,965 A | | 3/1999 | Jiang et al. | |
| 5,999,413 A | * | 12/1999 | Ohuchi et al. | 361/772 |

(Continued)

FOREIGN PATENT DOCUMENTS

JP 03041146 A * 2/1991

(Continued)

OTHER PUBLICATIONS

"Area Tape Automated Bonding Ball Grid Array Technology" by Chin-Ching Huang and Ahmad Hamzehdoost, Ball Grid Array Technology, Chapter 14, pp. 443-464 (1995).

(Continued)

*Primary Examiner*—Alonzo Chambliss
(74) *Attorney, Agent, or Firm*—Knobbe, Martens, Olson & Bear LLP

(57) ABSTRACT

An attachment material is provided between the die and the solder balls of a TBGA or other flexible circuitry package that is sufficiently compliant to absorb pressure between the two, so as not to apply stress to the solder balls. The attachment material is also sufficiently rigid, with a low coefficient of thermal expansion (CTE), so that the material does not excessively expand and contract during thermal cycling relative to the die. More preferably, the attachment material has a CTE close to that of the die to prevent breakage of the tape at the junction between the tape and the die.

24 Claims, 5 Drawing Sheets

U.S. PATENT DOCUMENTS

| | | | |
|---|---|---|---|
| 6,012,224 A | 1/2000 | DiStefano et al. | |
| 6,049,038 A * | 4/2000 | Suzuki | 174/52.2 |
| 6,049,128 A * | 4/2000 | Kitano et al. | 257/737 |
| 6,114,761 A * | 9/2000 | Mertol et al. | 257/722 |
| 6,127,724 A * | 10/2000 | DiStefano | 257/675 |
| 6,131,278 A * | 10/2000 | MacQuarrie et al. | 29/840 |
| 6,211,572 B1 * | 4/2001 | Fjelstad et al. | 257/781 |
| 6,214,904 B1 * | 4/2001 | Tanaka et al. | 523/409 |
| 6,235,842 B1 * | 5/2001 | Kuwano et al. | 525/119 |
| 6,239,366 B1 * | 5/2001 | Hsuan et al. | 174/52.3 |
| 6,239,367 B1 * | 5/2001 | Hsuan et al. | 174/52.4 |
| 6,239,489 B1 * | 5/2001 | Jiang | 257/738 |
| 6,251,211 B1 * | 6/2001 | Lake | 156/273.3 |
| 6,265,782 B1 * | 7/2001 | Yamamoto et al. | 257/783 |
| 6,309,915 B1 * | 10/2001 | Distefano | 438/127 |
| 6,316,822 B1 * | 11/2001 | Venkateshwaran et al. | 257/666 |
| 6,468,830 B1 * | 10/2002 | Carson | 438/106 |
| 6,521,480 B1 * | 2/2003 | Mitchell et al. | 438/108 |
| 6,576,984 B1 * | 6/2003 | Takahashi et al. | 257/668 |
| 6,746,896 B1 * | 6/2004 | Shi et al. | 438/108 |
| 6,770,981 B1 * | 8/2004 | Jiang et al. | 257/782 |
| 6,847,101 B1 * | 1/2005 | Fjelstad et al. | 257/668 |
| 6,856,011 B1 * | 2/2005 | Choi | 257/687 |

FOREIGN PATENT DOCUMENTS

KR        2002078839 A  * 10/2002

OTHER PUBLICATIONS

"Face-down BGA shrinks memory products by 75%", by Spencer Chin, Outlook.

"Tessera's Micro-Ball Grid Array (μBGA)", Chapter 16, pp. 259-282.

"Advanced Encapsulant Systems for Flip-Chip-on-Board Assemblies: Underfills with Improved manufacturing Properties" by Daniel R. Gamota and Cindy M. Melton, IEEE Transactions on Components, Packaging, and Manufacturing Technolgy—Part C, vol. 21, No. 3, Jul. 1998.

* cited by examiner

DIE ATTACH MATERIAL FOR TBGA OR FLEXIBLE CIRCUITRY

BACKGROUND OF THE INVENTION

1. Field of the Invention

The present invention relates to integrated circuit packages, and more particularly, to a die attach material for a Tape Ball Grid Array (TBGA) or other flexible circuitry package.

2. Description of the Related Art

In the last few decades, the electronics industry has literally transformed the world. Electronic products are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems and video camcorders, are just a few of the electronic products that have been developed in recent years and which have been made smaller and more compact, while providing more and/or enhanced functions than ever before. The integrated circuit (IC) chip, and the more efficient packaging of the IC chip, has played a key role in the success of these products.

The IC chip is not an isolated island. It must communicate with other chips in a circuit through an Input/Output (I/O) system of interconnects. Moreover, the IC chip and its embedded circuitry are delicate, and must therefore be protected in a package that can both carry and protect it. As a result, the major functions of the IC package are: (1) to provide a path for the electrical current that powers the circuits on the chip; (2) to distribute the signals on to and off of the chip; (3) to remove the heat generated by the circuit; and (4) to support and protect the chip from hostile environments.

As ICs become more complex, and printed circuit boards become more crowded, IC packages continually need more leads or pins while their footprints consume smaller and smaller areas. In an effort to meet these demands, developers created the ball grid array (BGA) package.

A typical BGA package includes an IC affixed to a flexible polyimide tape. A very thin conductor or wire bond connects a pad on the IC to a conductive trace on the polyimide tape. The conductive trace is routed to a solder ball. The solder ball is one of an array of solder balls that connect to the opposite side of the polyimide tape and protrude from the bottom of the BGA package. These solder balls interconnect with an array of pads located on a substrate, such as a printed circuit board. Accordingly, the typical BGA package electrically connects each pad on an IC to a pad on a printed circuit board.

A variation of the BGA package that has been introduced recently is the Area Tape Automated Bonding (ATAB) Ball Grid Array (BGA) package, or more commonly referred to as simply the Tape Ball Grid Array (TBGA) package. The TBGA package advantageously provides high lead counts, as well as a thin, lightweight, high electrical and thermal performance, and a BGA surface mount. The conventional TBGA package consists of a tape sandwiched between a polyimide dielectric. At least one layer of the tape is formed into traces or conductors that interconnect a chip to a printed circuit board (PCB). See John H. Lau (Ed.), Ball Grid Array Technology, Chapter 14, "Area Tape Automated Bonding Ball Grid Array Technology" (McGraw-Hill, 1995), incorporated herein by reference.

Provided between the chip and solder ball array in many IC packages such as the TBGA package described above is an elastomer compliant layer. Such a layer is found, for instance, in Tessera's Micro Ball Grid Array (μBGA) package. See John H. Lau (Ed.), Ball Grid Array Technology, Chapter 1, "A Brief Introduction to Ball Grid Array Technologies" (McGraw-Hill, 1995), incorporated herein by reference. The elastomer layer is provided between the die and the solder balls to absorb pressure between the two, especially during mounting. The compliant die attach interface thus applies less stress to the solder balls to resist cracking. This compliant layer desirably has a super low modulus and large coefficient of thermal expansion (CTE). For instance, a compliant elastomer layer having a modulus of less than 10 ksi and a coefficient of thermal expansion (CTE) of greater than 200 ppm/° C. has been used. Other compliant layers having a modulus in the range of 0.5 and 10 ksi and a CTE in the range of 200 to 400 ppm/° C. have also been used.

One drawback of this design is that it induces a fatal failure mode. Because of the elastomer layer's high CTE and compliance, as compared to the die, during thermal exposure the elastomer expands and shrinks more rapidly than the die. This creates stress on the conductive leads connecting the solder ball array to the die, especially at the pads connecting the die to the leads, and causes breakage of the leads from the die. This failure mode is known as the heel break. The loss of electrical connection between the IC pads and the conductive traces results in lower yield rates and increases the overall cost of package manufacture.

SUMMARY OF THE INVENTION

One aspect of the present invention is directed to minimizing or eliminating the heel break problem that occurs in integrated circuit packages. An attachment material is provided between the die and the solder balls of the integrated circuit package that is sufficiently compliant to absorb pressure between the two, so as not to apply stress to the solder balls. The attachment material is also sufficiently rigid, with a low coefficient of thermal expansion (CTE), so that the material does not excessively expand and contract during thermal cycling relative to the die. More preferably, the attachment material has a CTE close to that of the die to prevent breakage of the tape at the junction between the tape and the die.

In one embodiment of the present invention, an adhesive layer is provided for use in an integrated circuit package for attaching a die to a solder ball array. The adhesive layer has a modulus of elasticity less than about 126 ksi at room temperature, and a coefficient of thermal expansion (CTE) of less than about 200 ppm/° C.

In another embodiment of the present invention, an integrated circuit package is provided, comprising a die, a die attach layer over the die, and an array of solder balls over the die attach layer. The die attach layer has a coefficient of thermal expansion of less than about 106 ppm/° C. The die attach layer in another embodiment also has a modulus of elasticity of less than about 126 ksi.

In another embodiment of the present invention, a first level integrated circuit package comprises a chip, an array of solder balls for connecting the first level package to a second level package, an adhesive layer between the chip and the array of solder balls, and a flexible tape connecting the array to the chip. The adhesive layer has a coefficient of thermal expansion of less than about 200 ppm/° C., more preferably less than about 150 ppm/° C., and even more preferably less than about 100 ppm/° C. In another embodiment, the adhesive layer also has a modulus of elasticity of greater than about 10 ksi and less than about 126 ksi.

In another embodiment of the present invention, a method of preventing breakage of a flexible tape bonded to a chip and connected to an array of solder balls is provided. The method comprises providing a compliant material between the chip and array of solder balls, the material having a coefficient of thermal expansion of less than about 106 ppm/° C. and a modulus of elasticity of less than about 126 ksi.

In another embodiment of the present invention, an integrated circuit package is provided comprising a substrate, more preferably a flexible substrate such as polyimide, and a chip. A plurality of conductive terminals such as an array of solder balls is provided on the substrate. A plurality of conductive leads electrically connects the conductive terminals to the chip. A compliant material between the chip and the substrate absorbs stress therebetween. The compliant material has a modulus of elasticity of less than about 126 ksi at room temperature and a coefficient of thermal expansion of less than about 200 ppm/° C.

DETAILED DESCRIPTION OF THE PREFERRED EMBODIMENTS

The embodiments described herein particularly relate to a die attach material provided between a die and a solder ball array for a μBGA package. However, it will be appreciated that the principles of the present invention pertain not only to μBGA technology, but also to other BGA, TBGA or flexible circuitry and other integrated circuit packaging where wire bonds or TAB bonds are used.

As described in greater detail below, the preferred die attach material has a low coefficient of thermal expansion to more closely resemble the coefficient of thermal expansion of the die. This prevents the material from excessively expanding and contracting during thermal cycling relative to the die, thereby reducing the amount of stress placed on the leads connecting the solder ball array to the die. The die attach material is also preferably sufficiently rigid to further resist excessive movement relative to the die and the solder ball array, while having a low modulus of elasticity in order to absorb pressure between the die and the solder ball array.

Figure 1A:
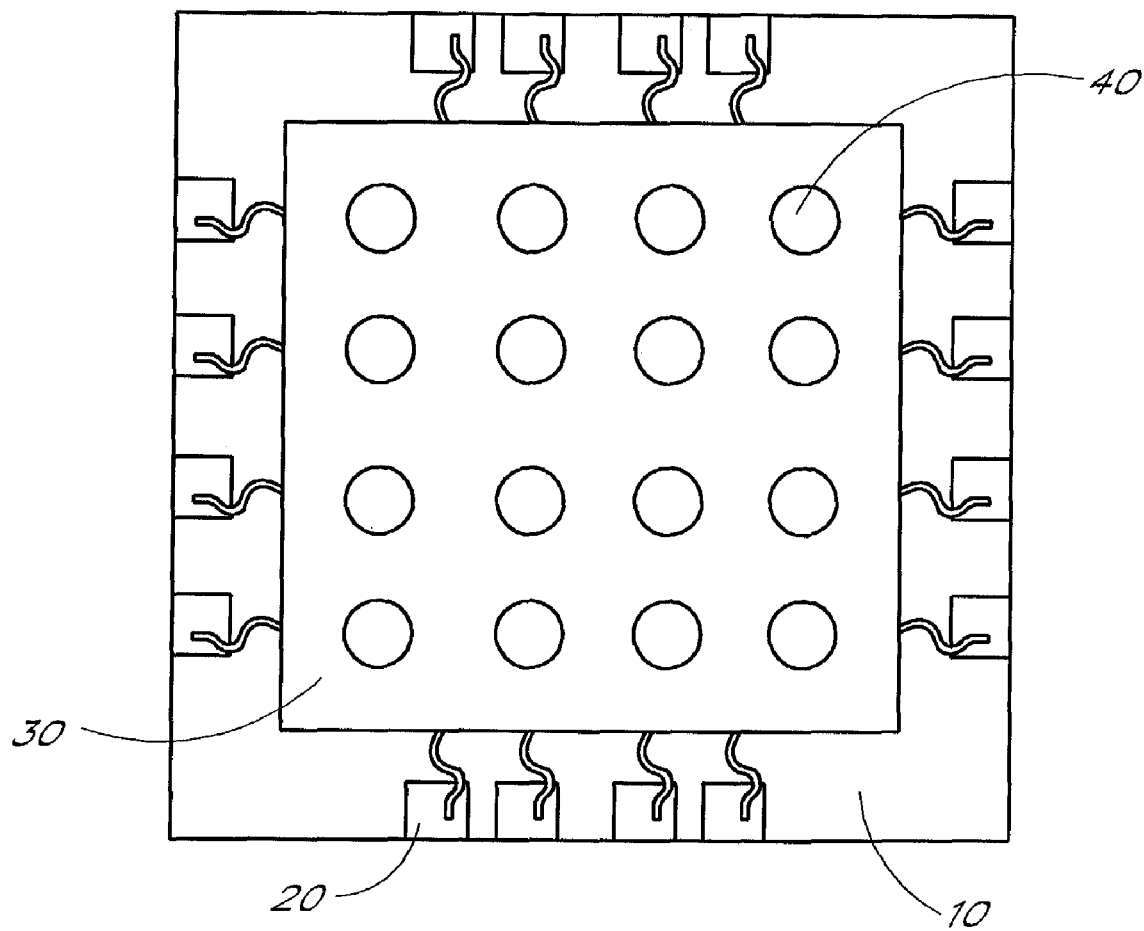
FIG. 1A shows a bottom view of a face-down, fan-in package employing an expansion lead, according to one embodiment of the present invention.
Figure 1B:
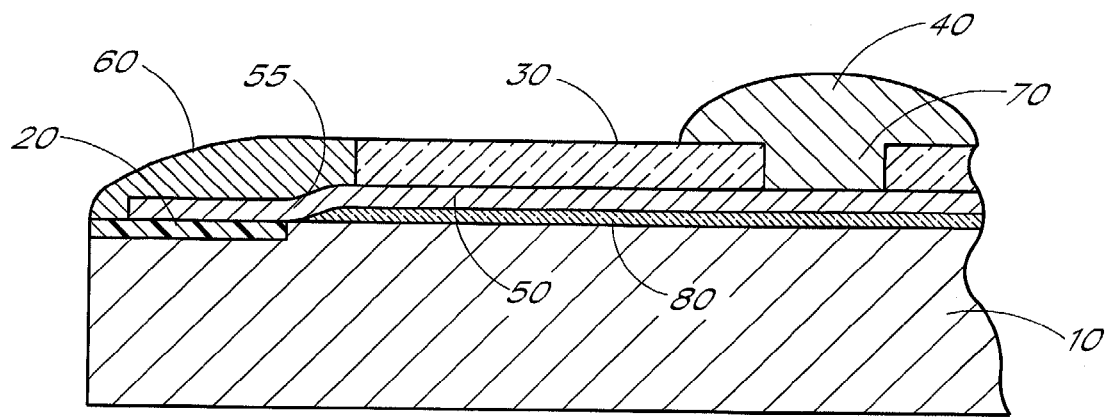
FIG. 1B shows a fragmentary cross-sectional view of a face-down, fan-in package employing an expansion lead, according to one embodiment of the present invention.

FIGS. 1A and 1B show a face view and a fragmentary cross-sectional view, respectively, of a chip 10 having a plurality of chip contacts 20 on a contact bearing surface. A sheet-like dielectric chip carrier substrate 30 overlies and is typically centrally located on the contact bearing surface of the chip 10 so that the chip contacts 20 are exposed. The substrate 30 may merely overlie the contact bearing surface of the chip 10; however, typically, the substrate is adhesively attached to the chip surface using a thin layer of adhesive material 80, as shown in FIG. 1B.

The substrate 30 may be comprised of a rigid or flexible material. Preferably, the substrate is comprised of a sheet of polyimide having a thickness approximately between 25 and 100 microns. The first surface of the substrate 30 has a plurality of conductive terminals 40 thereon. Each of the terminals 40 is electrically connected to a chip contact 20 through conductive leads 50 extending along the opposite side of the substrate and connected to the leads 50 through conductive vias 70. Alternately, the substrate could simply be removed so that solder ball terminals could be placed directly onto the ends of the leads 50 without the need of the conductive vias 70.

Each lead 50 has an expansion section 55 extending from an edge of the substrate 30. The expansion sections are each bonded to a chip contact 20, typically using conventional ultrasonic or thermosonic bonding apparatus. Each expansion section 55 is laterally curved substantially parallel to the plane of the substrate 30 prior to the bonding operation. Preferably, the expansion sections 55 laterally curve at least twice in opposite directions (substantially "s" shaped) and may be curved more than twice. The leads 50 may further be detachably connected to a supporting structure prior to bonding as disclosed in U.S. Pat. Nos. 5,489,749 and 5,536,909 which are hereby incorporated by reference in their entirety.

Typically, the expansion sections 55 of the leads are encapsulated by a suitable encapsulant, such as silicone or epoxy, to protect them from contamination and damage. During operation of the packaged chip, the terminals are attached to a printed circuit board and the laterally curved shape of the expansion sections 55 of the leads 50 helps to compensate for the expansion and contraction of the chip during thermal cycling by having the ability to independently flex and bend. The aforementioned encapsulant 60 supports the expansion sections 55 of the leads 50 as they flex and bend and further helps to spread the forces acting on the leads. Further, a solder mask or coverlay may be placed over the exposed surface of the substrate 30 after the bonding and encapsulation steps such that only the terminals are exposed.

Figure 1C:
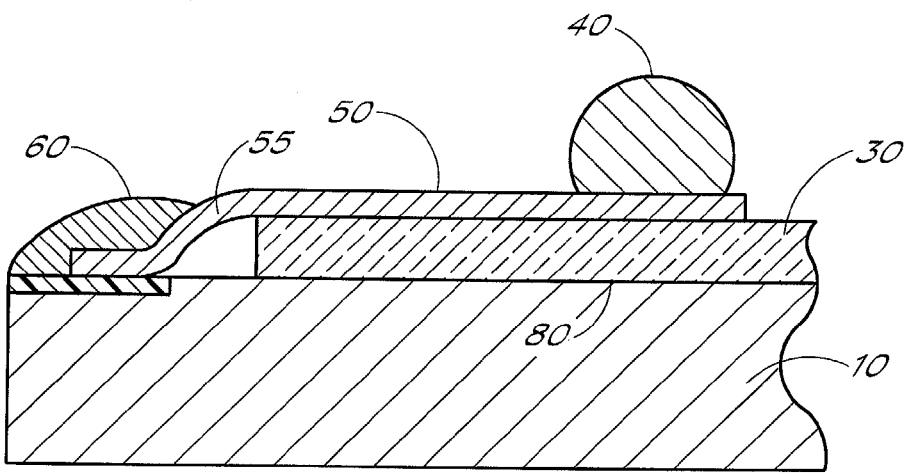
FIG. 1C shows a fragmentary cross-sectional view of a face-down, fan-in package employing an expansion lead having the leads on the second surface of the substrate, according to one embodiment of the present invention.

FIG. 1C shows a fragmentary cross-sectional view of an alternate embodiment in which the leads 50 are located on the same side as the terminals 40; thus, not requiring the conductive vias 70 (shown in FIG. 1B). A solder mask/coverlay is also used in the embodiment shown in FIG. 1C because the leads 50 and the terminals 40 are on the same side of the substrate 30. The solder mask/coverlay provides a dielectric coating ensuring that the solder connecting the terminals to contacts on the printed circuit board does not wick down the leads or short to other soldered terminals.

Figure 1D:
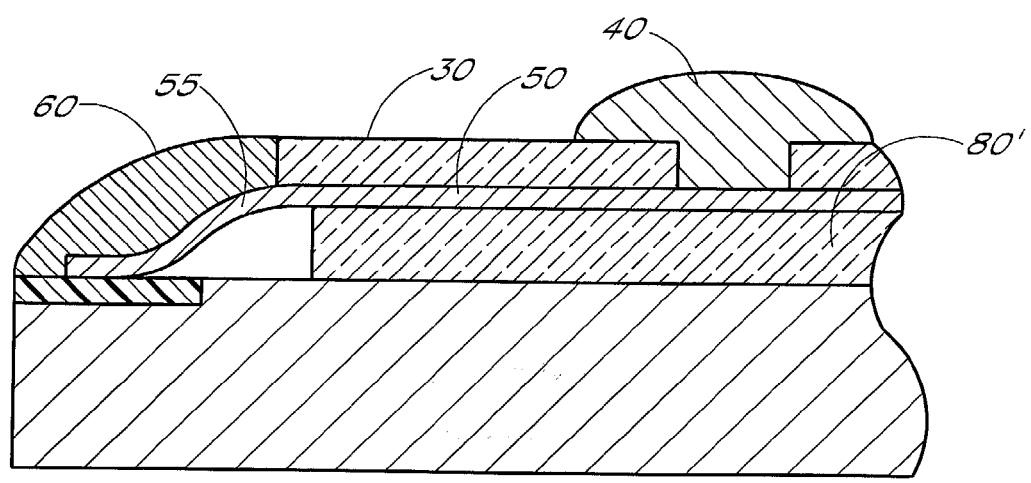
FIG. 1D shows a fragmentary cross-sectional view of a face-down, fan-in package employing an expansion lead wherein a compliant layer is disposed between the face surface of the chip and the first surface of the substrate, according to one embodiment of the present invention.

FIG. 1D shows a fragmentary cross-sectional view of an alternate embodiment in which the thin layer of adhesive from FIG. 1B has been replaced with a thicker layer of compliant material 80' to give added compensation for thermal mismatch, as disclosed in U.S. Pat. Nos. 5,148,265 and 5,148,266 which are hereby incorporated by reference in their entirety. The compliant material 80' is typically about 50 to 200 microns thick and is comprised of either a thermoset or a thermoplastic material. The structure shown in FIG. 1D also allows the expansion sections 55 of the leads 50 to be shaped by the bonding operation so that they are curved in a direction perpendicular to the lateral curve of the leads 50. As stated above, these laterally and vertically curved leads are typically supported by the encapsulant 60 so as to spread the forces acting upon them during thermal cycling of the operational package. Further details regarding these and other embodiments are disclosed in U.S. Pat. No. 5,821,608, the entirety of which is hereby incorporated by reference.

Figure 2:
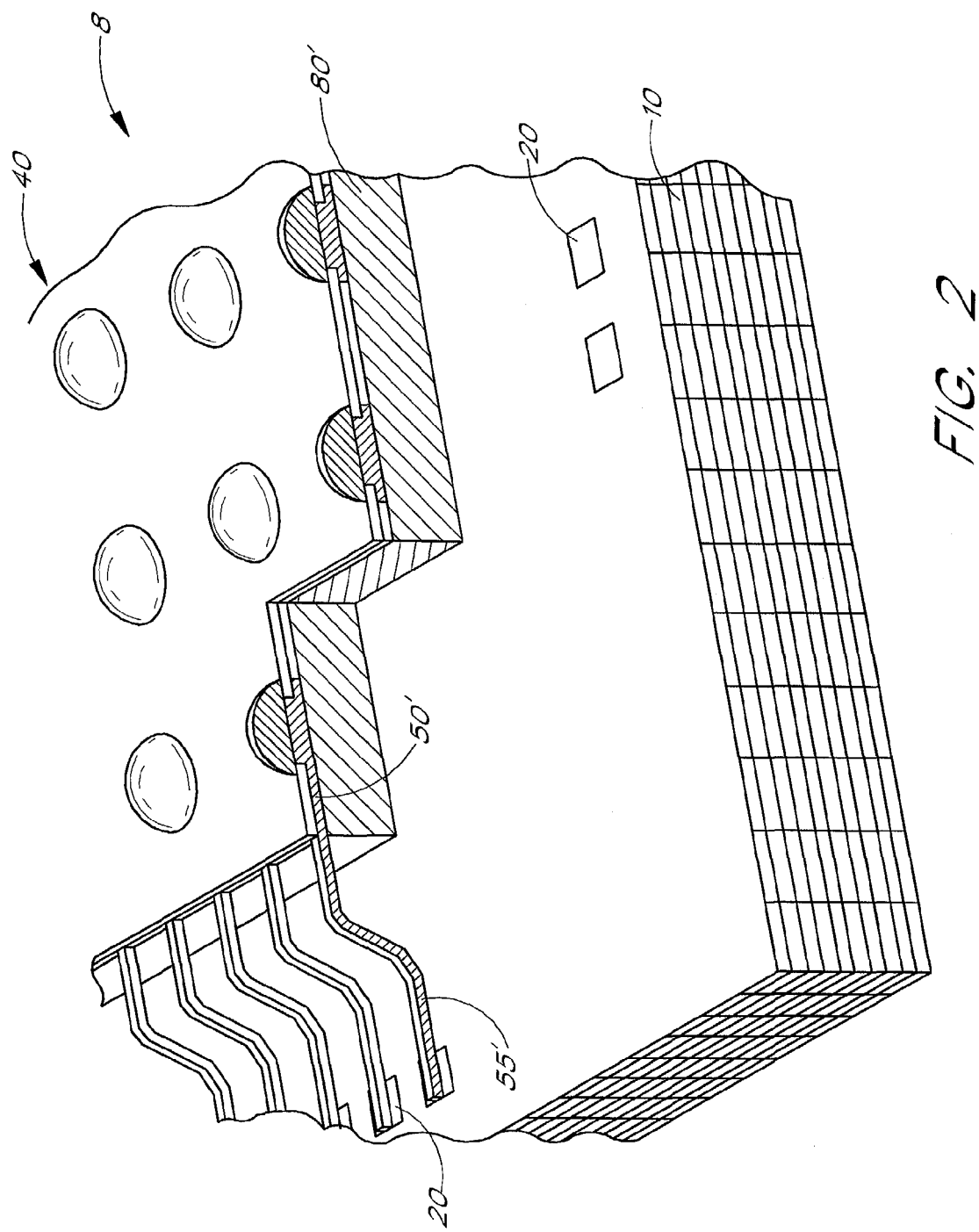
FIG. 2 is a perspective view of a μBGA package.

FIG. 2 illustrates one embodiment of the present invention in which a first level package 8 is provided, wherein like components are numbered in accordance with FIGS. 1A–1D above. In the IC packaging industry, it is common to refer to the placement of the IC chip within a suitable package as "1st level" packaging. The placement or mounting of the IC package on a suitable printed circuit board (PCB) or other substrate, is referred to as "2nd level" packaging. The interconnection of the various PCBs or other carriers within an electronic system, e.g., through use of a motherboard, is referred to as "3rd level" packaging.

Figure 4:
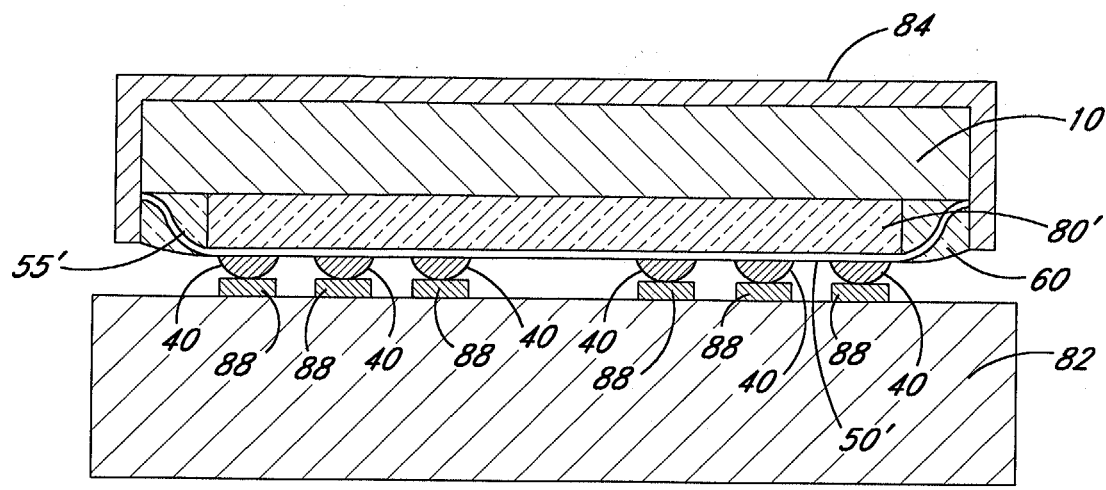
FIG. 4 is a cross-sectional view of a first level package being attached to a second level package.
Figure 5:
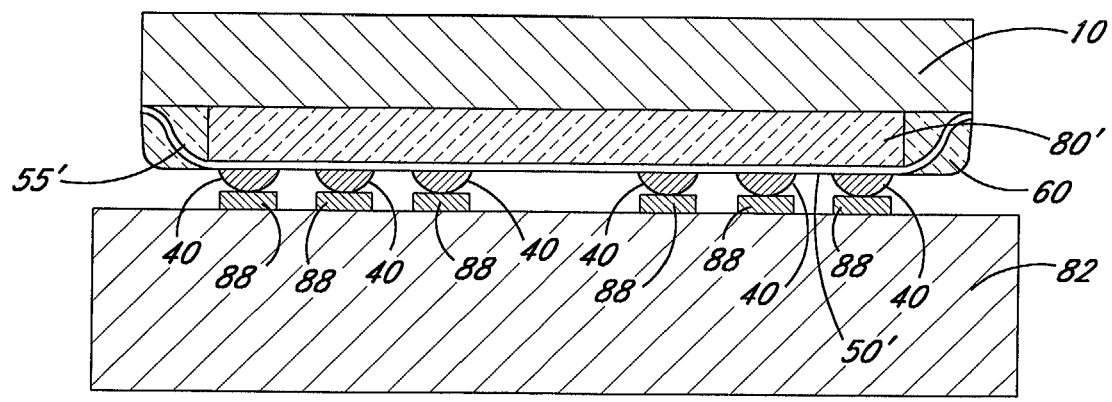
FIG. 5 is a cross-sectional view of the first level package of FIG. 4, shown without the first level package case.

The package 8 is preferably a ball grid array (BGA) package having a plurality of solder balls 40 that interconnects the package to a printed circuit board (see FIGS. 4 and 5). More preferably, the BGA package 8 is a TBGA package, and is even more preferably a µBGA package. As shown in FIG. 2, in this package 8, a die or chip 10 is prepared for bonding with a second level package. As shown in FIG. 4, the integrated circuit die 10 of the BGA package is mounted to a printed circuit board 82 through solder pads 88 and enclosed by a rigid housing or lid 84, typically constructed from a molded plastic material, and encapsulant 60. FIG. 5 illustrates an alternative embodiment of the µBGA package without a package case 84.

The die 10 will be understood by one of ordinary skill in the art to be any integrated circuit. For example, the die 10 can be from a wide range of integrated circuit products, such as: microprocessors, co-processors, digital signal processors, graphics processors, microcontrollers, memory devices, reprogrammable devices, programmable logic devices, and logic arrays.

A die attach material 80' is provided over the die 10, and a solder ball array 40 is provided over the die attach material that serves to make the connection to the next-level package. The solder balls 40 are preferably relatively flexible and can thus compensate for any lack of flatness in the printed circuit board or package. Additionally, the solder balls are assembled in an array, and thus provide a relatively high throughput. In one preferred embodiment, the solder balls are made of a SnPb eutectic material such as Sn63Pb37 and have a diameter of about 0.3 to 0.5 mm. The bump pitch on the tape can be as small as about 0.25 to 1 mm and is more preferably about 0.5 mm.

Tape 50' extends over the die attach material forming a connection with the solder ball array 40. TAB leads 55' extend from the tape 50' to form a connection with the die 10 at die pads 20. The tape 50' preferably comprises a conductive material such as copper for connecting a die pad 20 to a solder ball 40, and a polyimide material to connect the solder balls The tape 50' preferably has a thickness of about 50 µm.

Figure 3:
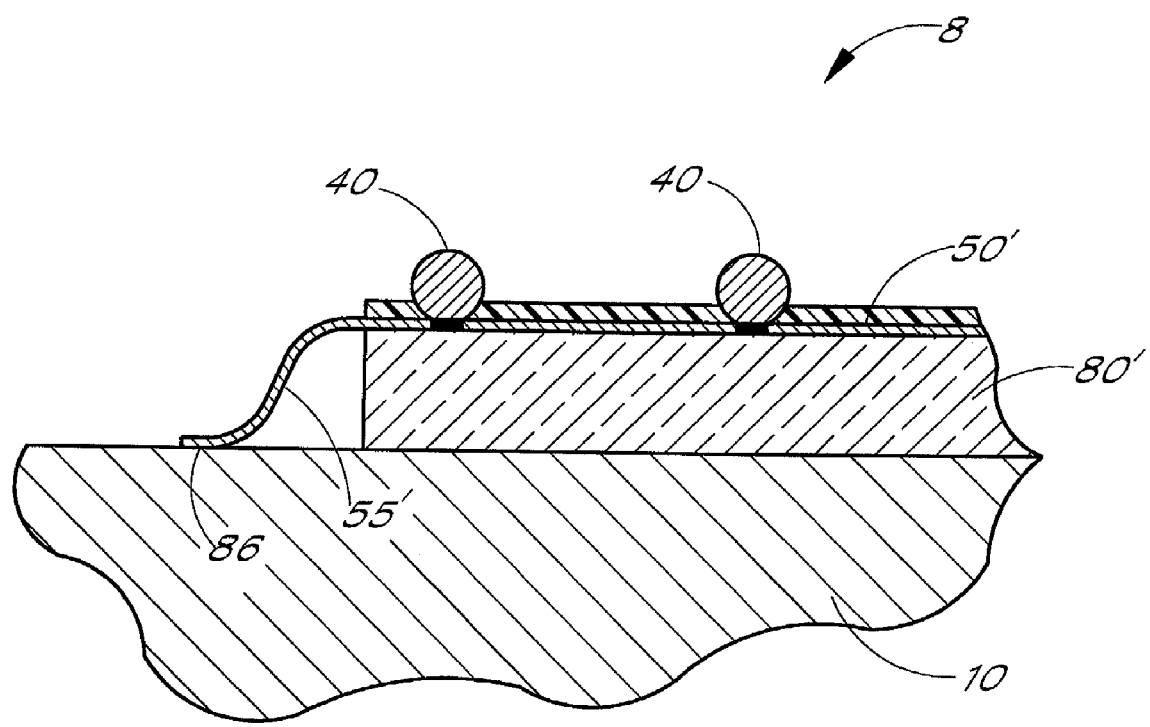
FIG. 3 is a cross-sectional view of an adhesive layer joining a die to an array of solder balls according to one preferred embodiment of the present invention.

FIG. 3 illustrates in cross-section a close-up view of the first level package 8 of FIG. 2. Leads 55' are preferably ultrasonically bonded to the die 10 at die pads 20 (not shown). The point where the leads 55' contact the die 10 is the heel 86.

The die attachment layer 80' can be made from an epoxy modified with elastomeric material used to prevent breakage of the leads 55' from the die 10 at the heel 86 (the heel break). The thickness of the layer is preferably about 3 to 9 mils, more preferably about 5 to 7 mils. In one embodiment, the die attachment layer has a modulus of elasticity of about 126 ksi at room temperature. This die attachment layer preferably has a glass transition temperature $T_g$ of about 42° C., a coefficient of thermal expansion (CTE) of about 106 ppm/° C. or less below $T_g$, and a CTE of about 234 ppm/° C. above $T_g$. Such a material is available from Ablestik Lab of Rancho Dominguez, Calif., No. RP 559-2A.

It will be appreciated that in accordance with the embodiments of the present invention, the modulus may be chosen to be greater to obtain a more rigid material, or less to obtain a more compliant material, depending on the desired properties of the package. It will also be appreciated that an attachment layer formed of different materials, with different dimensions and having different properties, may be used in accordance with the preferred embodiments of the present invention.

For instance, the die attach layer 80' is designed to have a low CTE in order to minimize the amount of expansion and contraction of the layer, especially relative to the die 10 and the tape 50', thereby preserving the connection between the die 10 and the leads 55' at the heel 86. This is important because the package 8 may undergo temperature cycling, for example, between −55 and 125° C., for up to 1000 cycles or more.

In one embodiment, the die or chip 10 has a CTE of about 3 ppm/° C. and the tape 50' has a CTE of about 20 ppm/° C. The CTE of the tape 50' is the "effective CTE" of the combined layers forming the tape. Thus, as compared to the prior art, it has been discovered that a die attach layer 80' with a CTE closer to that of the die and the tape is desirable, preferably less than 200 ppm/° C., more preferably less than 150 ppm/° C. In the embodiment described above, it has been found that a CTE of less than about 100 ppm/° C. is sufficient to alleviate the heel break problem. The reduced movement of the die attach layer 80' because of the low coefficient of thermal expansion reduces the risk of breakage of the leads 55' at the heel 86.

While the die attach layer preferably has a low coefficient of thermal expansion, the present inventors have found that the layer should still be sufficiently compliant to absorb stresses between the die 10 and the solder balls 40. However, as compared to the prior art, in one embodiment, the modulus of elasticity of the die attach layer 80' is selected to be higher than that of previous die attach layers. Thus, wherein some prior art die attach layers have a modulus of less than 10 ksi, one embodiment of the present invention provides a die attach layer with a modulus of greater than about 10 ksi, more preferably greater than about 50 ksi, even more preferably greater than about 100 ksi, and in one embodiment, up to about 126 ksi. The higher modulus provides improved resistance to movement in the die attach layer, thereby decreasing the amount of stress concentrated at the heel 86. At the same time, the modulus of the layer 80' is still sufficiently compliant to reduce the amount of stress applied to the solder balls 40.

It will be appreciated that the die attach materials described herein may be used not only in µBGA packages, but also in other integrated circuit packages as well. Other types of integrated circuit package applications as would be known by one of skill in the art include, but are not limited to, any package using a flexible substrate. Examples include Chip-on-flex, Micron Tape BGA (MTBGA), D²BGA and BOCBGA with flexible substrates.

In general, the die attach material described by the preferred embodiments above advantageously is a sufficiently compliant material to absorb the pressure between an integrated circuit die and the solder balls of the integrated circuit package. At the same time, the attachment material is also sufficiently rigid, with a low coefficient of thermal expansion (CTE), so that the material does not excessively expand and contract during thermal cycling relative to the die. More preferably, the low CTE of the die attach material alleviates the heel break problem of the tape in a BGA package at the junction between the tape and the die.

The embodiments illustrated and described above are provided merely as examples of certain preferred embodiments of the present invention. Various changes and modifications can be made from the embodiments presented herein by those skilled in the art without departure from the spirit and scope of the invention, as defined by the appended claims.

What is claimed is:

1. An integrated circuit package, comprising:
a die;
a die attach layer over the die; and
an array of solder balls over the die attach layer;
wherein the die attach layer has a coefficient of thermal expansion of less than 100 ppm/° C.

2. The integrated circuit package of claim 1, further comprising a flexible tape connecting the array of solder balls to the die, wherein one end of the tape is located over the die attach layer, and another end of the tape is located over the die.

3. The integrated circuit package of claim 1, wherein the die attach layer has a thickness of between about 5 and 7 mils.

4. The integrated circuit package of claim 1, wherein the die attach layer is an epoxy modified with elastomeric material.

5. The integrated circuit package of claim 1, wherein the array is a ball grid array.

6. The integrated circuit package of claim 1, wherein the array is a tape ball grid array.

7. The integrated circuit package of claim 1, wherein the array is a micro ball grid array.

8. An integrated circuit package, comprising:
a die;
a die attach layer over the die; and
an array of solder balls over the die attach layer;
wherein the die attach layer has a coefficient of thermal expansion of less than about 106 ppm/° C. and a modulus of elasticity greater than about 100 ksi.

9. The integrated circuit package of claim 8, further comprising a flexible tape connecting the array of solder balls to the die, wherein one end of the tape is located over the die attach layer, and another end of the tape is located over the die.

10. The integrated circuit package of claim 8, wherein the die attach layer has a modulus of elasticity of less than about 126 ksi.

11. A first level integrated circuit package, comprising:
a first level package including a chip;
an array of solder balls for connecting the first level package to a second level package;
an adhesive layer between the chip and the array of solder balls, the adhesive layer having a coefficient of thermal expansion of less than about 200 ppm/° C. and a modulus of elasticity greater than about 100 ksi; and
a flexible tape connecting the array to the chip
wherein one end of the tape is located over the adhesive layer, and another end of the tape is located over the chip.

12. The package of claim 11, wherein the tape connects the array to the chip using μBGA technology.

13. The package of claim 11, wherein the adhesive layer has a coefficient of thermal expansion of less than about 150 ppm/° C.

14. The package of claim 11, wherein the adhesive layer has a coefficient of thermal expansion of less than about 100 ppm/° C.

15. A first level integrated circuit package, comprising:
a first level package including a chip;
an array of solder balls for connecting the first level package to a second level package;
an adhesive layer between the chip and the array of solder balls, the adhesive layer having a coefficient of thermal expansion of less than 100 ppm/° C. and a modulus of elasticity greater than about 10 ksi; and
a flexible tape connecting the array to the chip, wherein one end of the tape is located over the adhesive layer, and another end of the tape is located over the chip.

16. The package of claim 15, wherein the adhesive layer has a modulus of elasticity of greater than about 50 ksi.

17. The package of claim 16, wherein the adhesive layer has a modulus of elasticity of greater than about 100 ksi.

18. An integrated circuit package, comprising:
a flexible substrate;
a chip;
a plurality of conductive terminals on the substrate;
a plurality of conductive leads electrically connecting the conductive terminals to the chip; and
a compliant material between the chip and the substrate, the compliant material having a modulus of elasticity greater than about 100 ksi at room temperature and a coefficient of thermal expansion of less than about 200 ppm/° C.

19. The integrated circuit package of claim 18, wherein the plurality of conductive terminals includes an array of solder balls.

20. The integrated circuit package of claim 18, wherein the plurality of conductive leads includes TAB leads.

21. The integrated circuit package of claim 18, wherein the flexible substrate is a polyimide.

22. The integrated circuit package of claim 18, wherein the compliant material has a coefficient of thermal expansion of less than about 100 ppm/° C.

23. The integrated circuit package of claim 18, wherein the compliant material has a modulus of elasticity of less than about 126 ksi and greater than about 100 ksi.

24. The package of claim 17, wherein the adhesive layer has a modulus of elasticity of less than about 126 ksi.

* * * * *